United States Patent
Lee et al.

(10) Patent No.: US 7,768,112 B2
(45) Date of Patent: Aug. 3, 2010

(54) SEMICONDUCTOR PACKAGE FABRICATED BY CUTTING AND MOLDING IN SMALL WINDOWS

(75) Inventors: Kuo-Yuan Lee, Kaohsiung (TW); Yung-Hsiang Chen, Kaohsiung (TW)

(73) Assignee: Walton Advanced Engineering Inc., Kaohsiung (TW)

( * ) Notice: Subject to any disclaimer, the term of this patent is extended or adjusted under 35 U.S.C. 154(b) by 0 days.

(21) Appl. No.: 12/542,304

(22) Filed: Aug. 17, 2009

(65) Prior Publication Data

US 2009/0302446 A1 Dec. 10, 2009

Related U.S. Application Data

(62) Division of application No. 12/003,634, filed on Dec. 28, 2007.

(51) Int. Cl.
H01L 23/02 (2006.01)
H01L 23/48 (2006.01)
H01L 23/52 (2006.01)
H01L 29/40 (2006.01)
H01L 23/28 (2006.01)

(52) U.S. Cl. .................. 257/680; 257/734; 257/776; 257/787

(58) Field of Classification Search .............. 257/680, 257/690, 738, 782, 723, 734, 776, 672, 676, 257/685, 688, 787, 788
See application file for complete search history.

(56) References Cited

U.S. PATENT DOCUMENTS 6,214,641 B1 * 4/2001 Akram ................ 438/107
7,550,842 B2 * 6/2009 Khandros et al. .......... 257/723

* cited by examiner

*Primary Examiner*—Chuong Anh Luu
(74) *Attorney, Agent, or Firm*—Muncy, Geissler, Olds & Lowe, PLLC (57) ABSTRACT

A method for cutting and molding in small windows of a window-type semiconductor package and the semiconductor package fabricated from the same are revealed. According to the method, a substrate strip has a plurality of small windows disposed at the sides or at the corners of the substrate strip. The external surface of the substrate strip includes a plurality of window molding areas surrounding the small windows and extending to the scribe lines. A plurality of chips are disposed on the substrate strip. Then, an encapsulant is formed in the small windows to encapsulate the electrical connecting components and formed on the window molding areas so that the encapsulant extends to the scribe lines. Therefore, the mold flashes at the small windows can be effectively reduced. Additionally, the encapsulant on the window molding areas is cut when singulating the substrate units so that the adhesion area of the encapsulant to the substrate strip is increased to prevent the delamination of traces and solder mask of the substrate units.

7 Claims, 7 Drawing Sheets

SEMICONDUCTOR PACKAGE FABRICATED BY CUTTING AND MOLDING IN SMALL WINDOWS

CROSS REFERENCE TO RELATED APPLICATION

This application is a Divisional of co-pending application Ser. No. 12/003,634, filed on Dec. 28, 2007, and for which priority is claimed under 35 U.S.C. §120; the entire contents of which are hereby incorporated by reference.

FIELD OF THE INVENTION

The present invention relates to fabrication technologies of semiconductor devices, especially to a fabrication method of cutting and molding in small windows of window-type semiconductor packages.

BACKGROUND OF THE INVENTION

The Window Ball Grid Array, WBGA, semiconductor package becomes the major packages for IC memory devices where a WBGA package primarily comprises a substrate having window(s) to carry and electrically connect an IC chip and an encapsulant protecting the chip. However, at least a molding area on the bottom surface of the substrate is formed around the window where mold flash will easily occur. Since the window in the substrate of a conventional window-type BGA is a single central slot located at the center of the substrate, a distance is kept between the molding area and the external pads so that the mold flash can still be well controlled. However, in the new generation of window-type BGA, a plurality of small windows are disposed at the sides and at the corners of the substrate to increase the electrical routing density and to meet the requirement of finer pitches between electrical terminals, however, the problem of mold flash becomes worse due to smaller pitches between the molding area and the external pads. Eventually, the quality of the electrical connections will be affected by the mold flashes.

Figure 1:
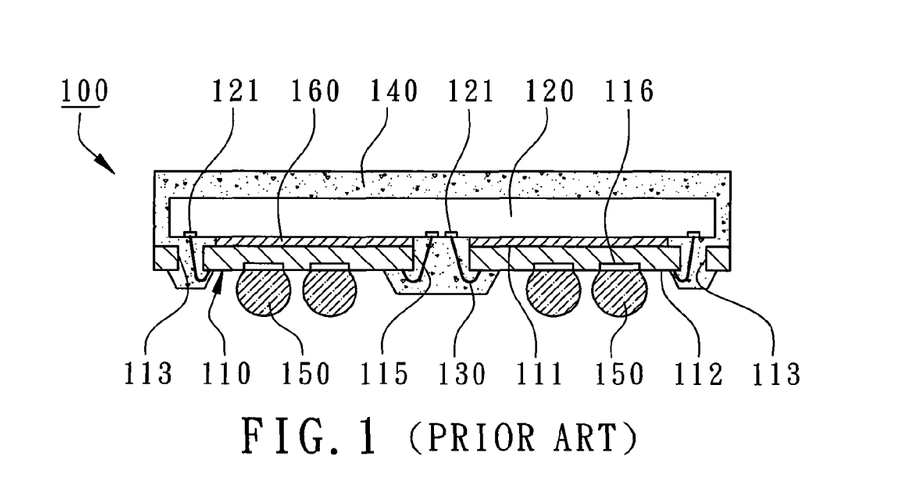
FIG. 1 shows a cross-sectional view of a conventional window-type BGA semiconductor package.
Figure 2:
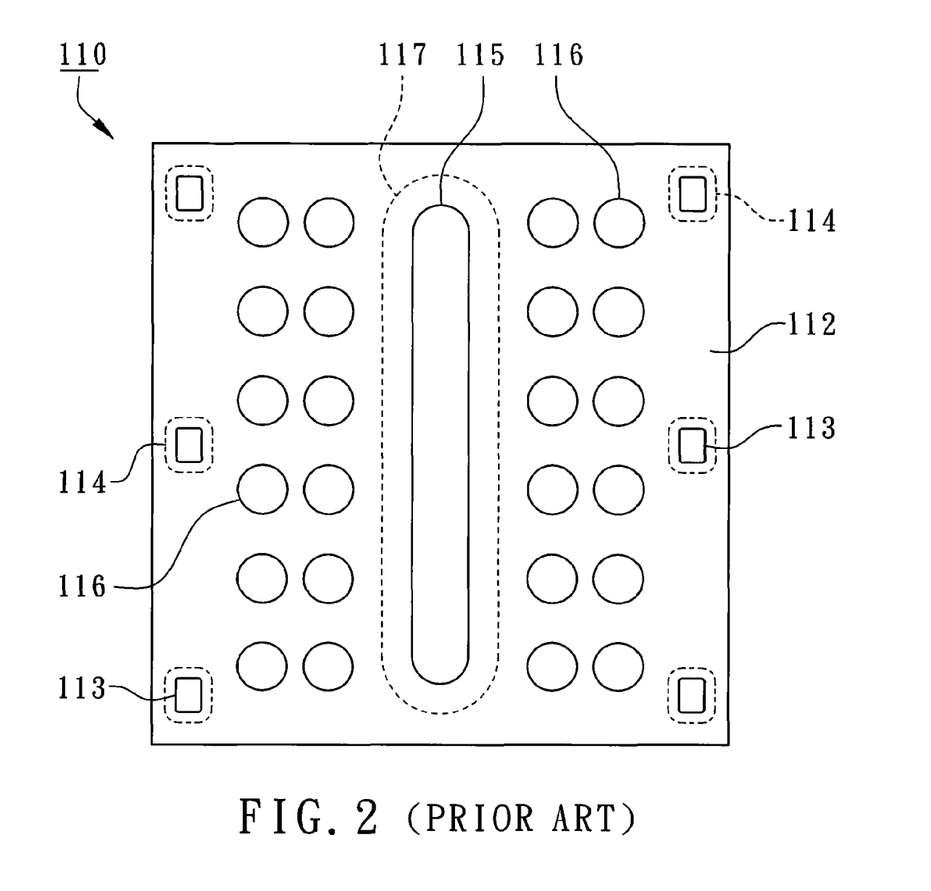
FIG. 2 shows an external surface of a substrate unit of the conventional window-type BGA package.

As shown in FIG. 1, a conventional window-type BGA package 100 primarily comprises a substrate unit 110, a chip 120, a plurality of electrical connecting components 130, and an encapsulant 140 where the substrate unit 110 is formed by singulating from a substrate strip. The substrate unit 110 has a die-attaching surface 111, an external surface 112, and a plurality of small windows 113 penetrating the substrate unit 111. As shown in FIG. 2, the small windows 113 are formed adjacent to the sides or to the corners of the substrate unit 110. A plurality of small window molding areas 114 are formed on the external surface 112 for the formation of the encapsulant 140 where the small window molding areas 114 surround the small windows 113 without extending to the corresponding sides nor corners of the substrate units 110. The substrate unit 110 further has a central slot 115. The external surface 112 further includes a bottom molding area 117 to surround the central slot 115. Furthermore, as shown in FIGS. 1 and 2, the substrate unit 110 further has a plurality of external pads 116 formed on the external surface 112 for disposing a plurality of external terminals 150 such as solder balls.

As shown in FIG. 1 again, a chip 120 has a plurality of bonding pads 121 disposed on its active surface and is attached to the die-attaching surface 111 of the substrate unit 110. The electrical connecting components 130 are formed by wire bonding to electrically connect the bonding pads 121 to the substrate unit 110 by passing through the small windows 113 and the central slot 115. The encapsulant 140 is formed on the die-attaching surface 111 and on the small window molding areas 114 and the bottom molding area 117 to encapsulate the chip 120 and the electrical connecting components 130. The molding area of the external surface 112 has to be controlled within the window molding area 114 and the bottom molding area 117. Since the conventional window BGA has many small windows 113, the mold flashes at the small window molding area 114 can easily contaminate the external pads 116 leading to poor electrical connections between the external terminals 150 and the external pads 116. Moreover, during singulation of substrate strip, the traces and solder mask at the sides or the corners of the substrate units are easily delaminated leading to poor package quality and reliability.

Furthermore, after die attachment and wire bonding processes, a molding process will be followed. A corresponding bottom mold chest has to be designed according to the locations and dimensions of the central slot 115 and the smaller windows 113 of a conventional window-type BGA. When the number of small windows 110 is increased, the cost of design the corresponding bottom mold chest will increase and the issue of mold flashed will become more serious.

SUMMARY OF THE INVENTION

The main purpose of the present invention is to provide a method for singulating of a window-type semiconductor package to reduce or even eliminate mold flashes at the sides or the corners of the substrate units and to prevent delamination of traces and solder mask of the substrate units during singulation of substrate strip to enhance package quality and reliability.

The second purpose of the present invention is to provide a method for singulating of a window-type semiconductor package to simplify the design of bottom mold chest and to reduce the cost of packaging tooling.

The third purpose of the present invention is to provide a method for singulating of a window-type semiconductor package to design the mold flash area at the scribe lines of the substrate strip to control the formation of mold flashes to increase packaging yield.

According to the present invention, a fabrication method for singulating of a window-type semiconductor package primarily comprises a plurality of processing steps as follows. A substrate strip is provided, including a plurality of substrate units and a plurality of scribe lines formed between the substrate units where the substrate strip has a die-attaching surface, an external surface and a plurality small windows formed at the sides or the corners of the substrate units penetrating through the substrate strip. The external surface includes a plurality of window molding areas surrounding the small windows extending to the scribe lines. Then, a plurality of chips are deposited on the die-attaching surface of the substrate strip where the chips are located inside the substrate units without covering the scribe lines. Then, a plurality of electrical connecting components are formed through the small windows to electrically connect the chips to the substrate strip. Then, an encapsulant is formed on the window molding areas and in the small windows to encapsulate the electrical connecting components. Finally, the substrate strip and the encapsulant are cut along the scribe lines to singulate individual substrate units. A semiconductor package fabricated formed from the method is also disclosed.

DETAILED DESCRIPTION OF THE INVENTION

Please refer to the attached drawings, the present invention will be described by means of embodiments below.

Figure 3:
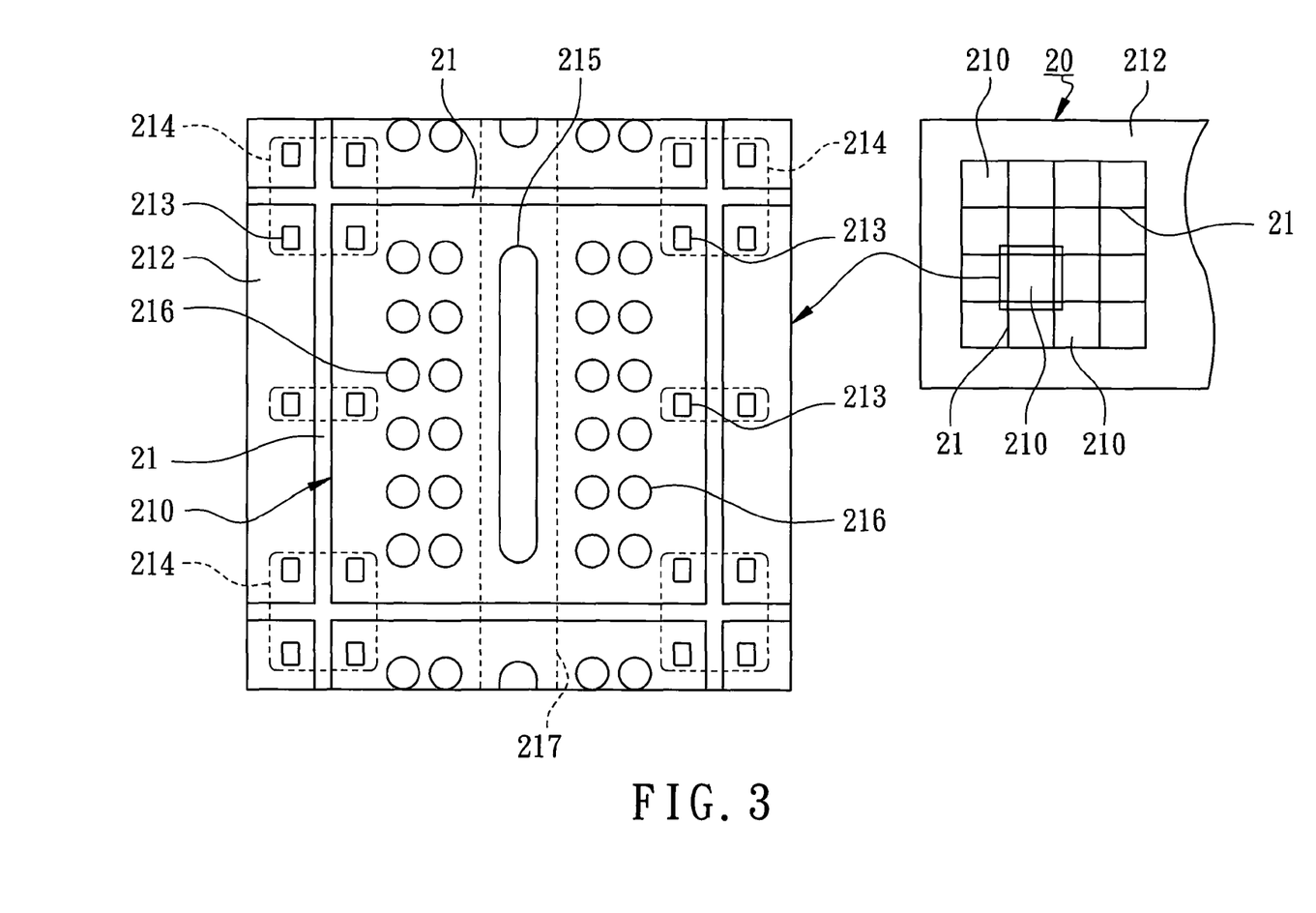
FIG. 3 shows an external surface of a substrate strip for window-type BGA packages including an enlarged view of one substrate unit according to the first embodiment of the present invention.
Figure 4A:
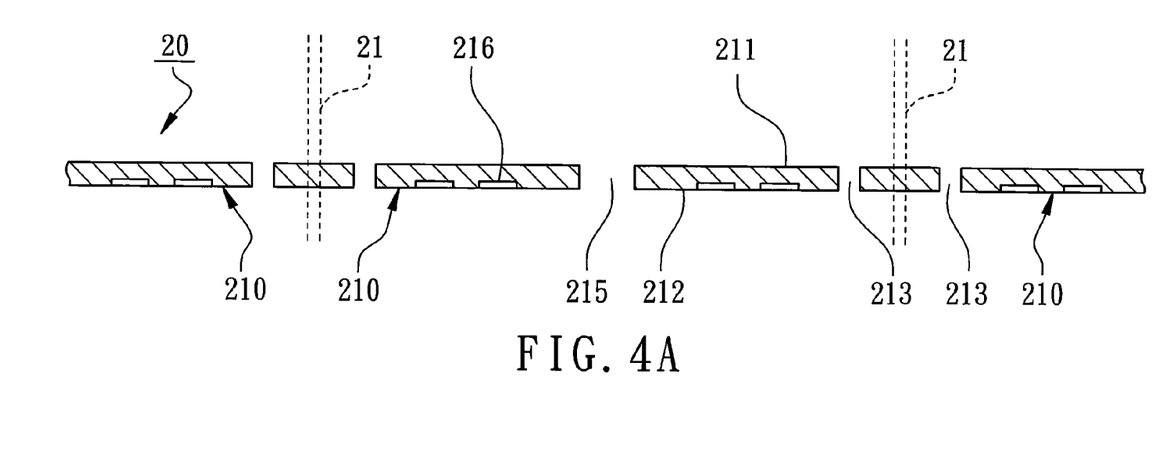
FIGS. 4A to 4F show partial cross-sectional views of a substrate strip for window-type BGA packages during packaging processes according to the first embodiment of the present invention.

According to the first embodiment of the present invention, a fabrication method for singulating of a window-type semiconductor package is disclosed. As shown in FIG. 3 and FIG. 4A, a substrate strip 20 is provided, which includes a plurality of substrate units 210 and a plurality of scribe lines 21 formed between the substrate units 210 where the substrate units 210 can be the chip carriers for memory cards, BGA (Ball Grid Array) or LGA (Land Grid Array). The substrate strip 20 has a die-attaching surface 211, an external surface 212 and a plurality small windows 213 formed at the sides or the corners of the substrate units 210 and penetrating through the substrate strip 20 from the die-attaching surface 211 to the external surface 212. The external surface 212 includes a plurality of window molding areas 214 which surround the small windows 213 and extend to the scribe lines 21.

Figure 6:
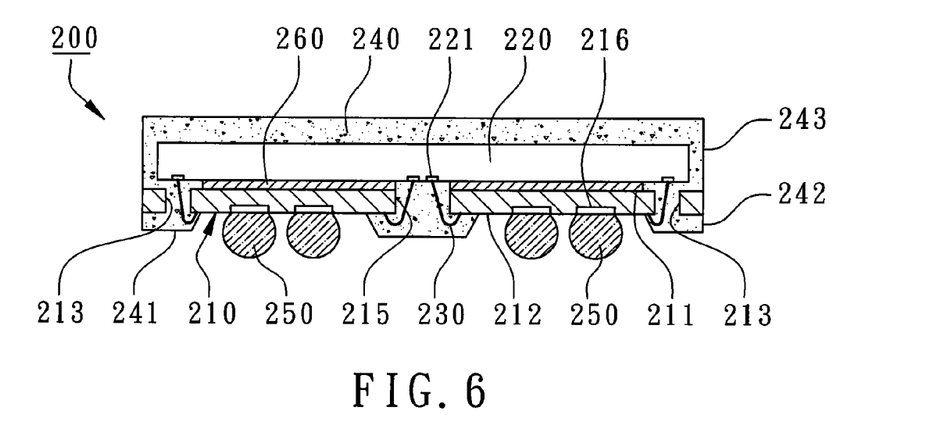
FIG. 6 shows a cross-sectional view of a fabricated window-type BGA package according to the first embodiment of the present invention.

Furthermore, the substrate strip 20 further has a plurality of external pads 216 formed on the external surface 212 for disposing a plurality of external terminals 250 as shown in FIG. 6. In the present embodiment, each substrate unit 210 further has a central slot 215 penetrating the substrate strip 20 and formed at the center of the substrate unit 210. The external surface 212 further includes a plurality of bottom molding areas 217 surrounding the central slots 215. In the present embodiment, the bottom molding areas 217 of the adjacent substrate units 210 are connected to each other.

Figure 4B:
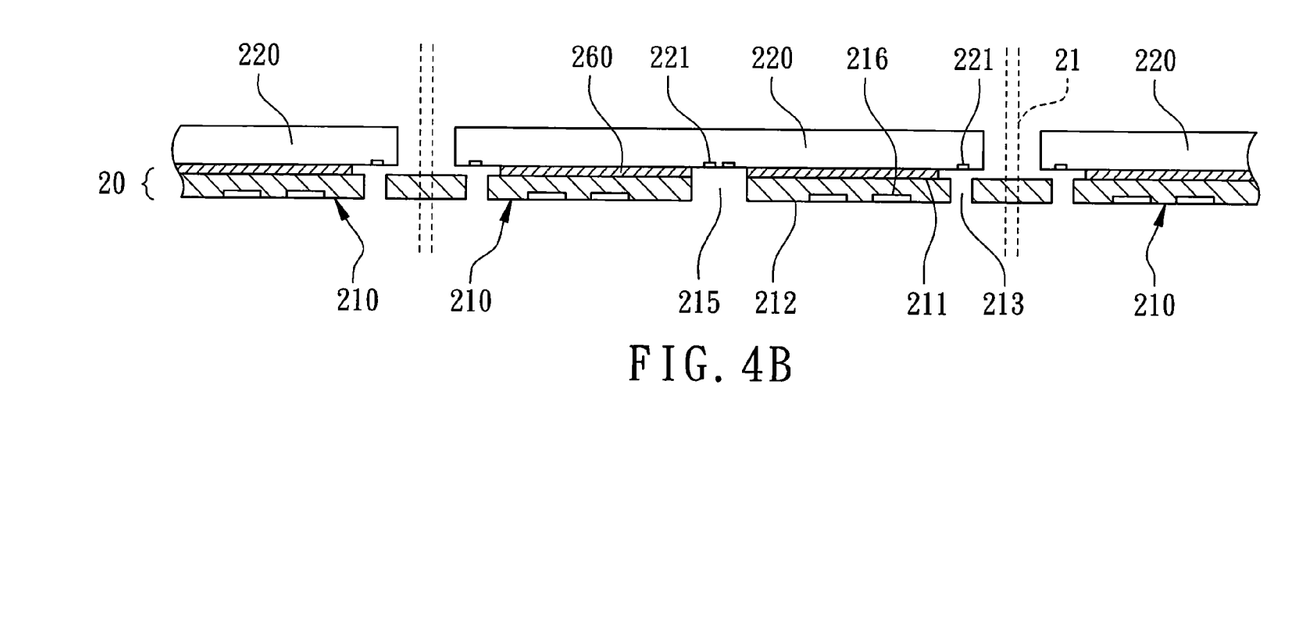

Then, as shown in FIG. 4B, a plurality of chips 220 are deposited on the die-attaching surface 211 of the substrate strip 20 where the chips 220 are located inside the substrate units 210 without covering the scribe lines 21. Each chip 220 has a plurality of bonding pads 221 disposed at the peripheries or at both the peripheries and the centers of the active surface of the chip 220. The active surface of the chip 220 is attached to the die-attaching surface 211 of the substrate strip 20 by a die-attaching material 260 such as a B-stage printed film or a PI (polyimide) tape where the bonding pads 221 are aligned within the small windows 213 and the central slot 215 for the following electrically connecting step. Preferably, the footprint of the chips 220 on the substrate strip 20 cannot be smaller than 70% of the corresponding substrate units 210 on the die-attaching surface 211 to manufacture CSP's (Chip Scale Packages).

Figure 4C:
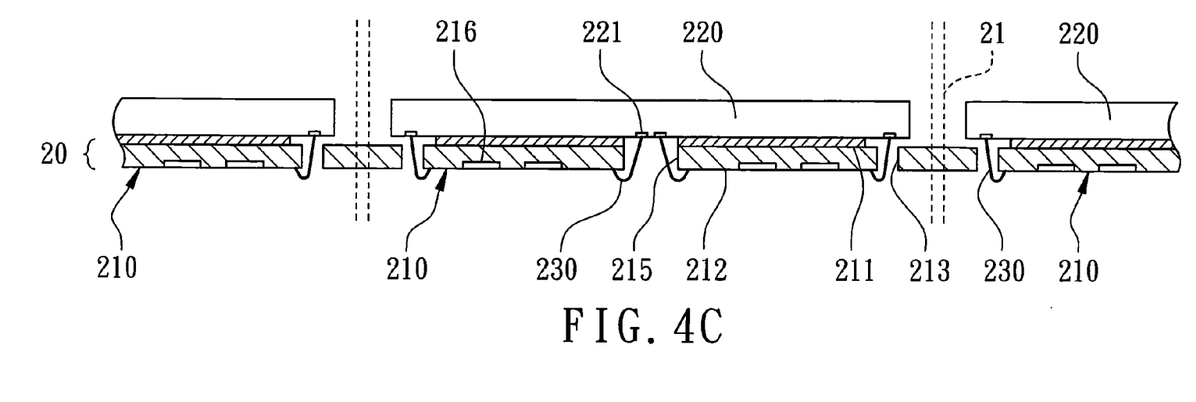

Then, as shown in FIG. 4C, a plurality of electrical connecting components 230 are formed through the small windows 213 as well as through the central slots 215 to electrically connect the bonding pads 221 of the chip 220 to the substrate strip 20. In the present embodiment, the electrical connecting components 230 include a plurality of bonding wires formed by wire-bonding method.

Figure 4D:
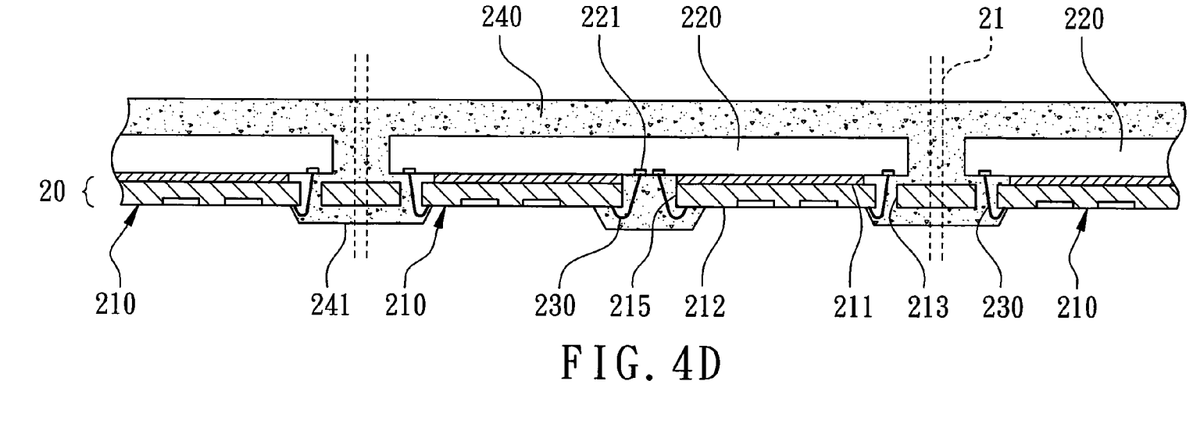
Figure 5:
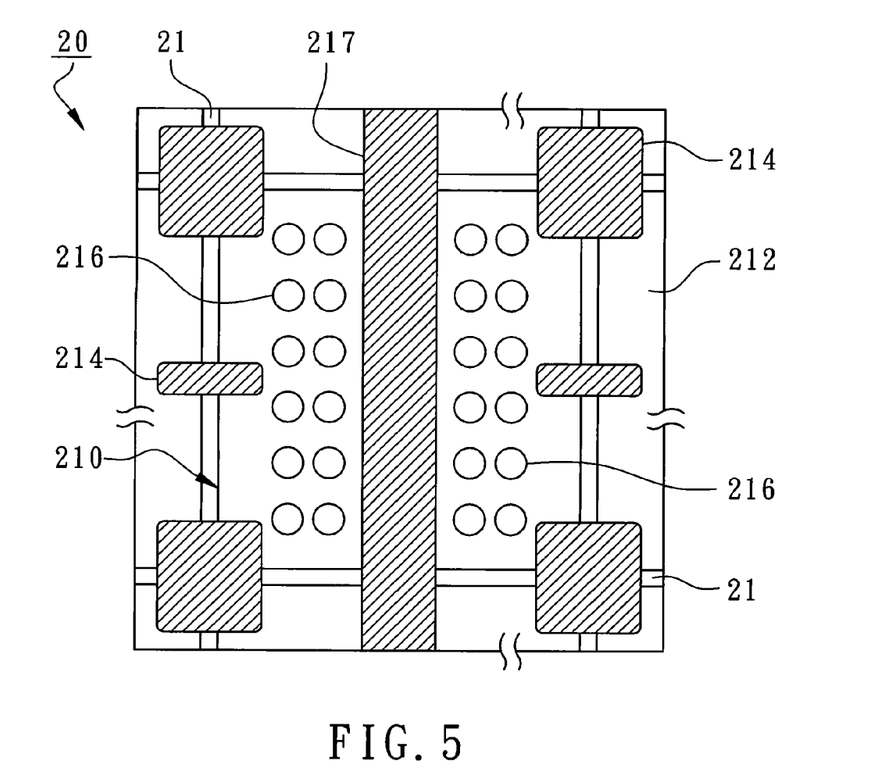
FIG. 5 shows the external surface of the substrate unit for the window-type BGA packages after a molding step according to the first embodiment of the present invention.

Then, as shown in FIG. 4D, an encapsulant 240 is formed on the window molding areas 214 of the substrate strip 20, as shown in FIG. 3, and in the small windows 213 to encapsulate the electrical connecting components 230. Therefore, as shown in FIG. 5, the encapsulant 240 further extends to the scribe lines 21. In the present embodiment, the encapsulant 240 is further formed on the die-attaching surface 211 and further covers the back surfaces of the chips 220 to encapsulate the chips 220. The encapsulant 240 is further formed in the central slots 215 and on the bottom molding areas 217 to encapsulate some of the electrical connecting components 230 passing through the central slots 215. As shown in FIG. 3, each window molding area 214 is adjacent to the sides of the substrate units 210 and covered the one across the scribe lines 21 to connect at least two of the small windows 213. Some of the window molding areas 214 adjacent to the corners of the substrate units 210 cover the intersections of the scribe lines 21 so that at least one of the window molding area 214 at the corners of the substrate units 210 connects at least four of the small windows 213. In the present embodiment, the encapsulant 240 is an Epoxy Molding Compound (EMC) and is formed by placing the substrate strip 20 between the top mold and the bottom mold during molding processes and then the EMC is cured. After curing, the encapsulant 240 is formed and ready for next processes.

Figure 4E:
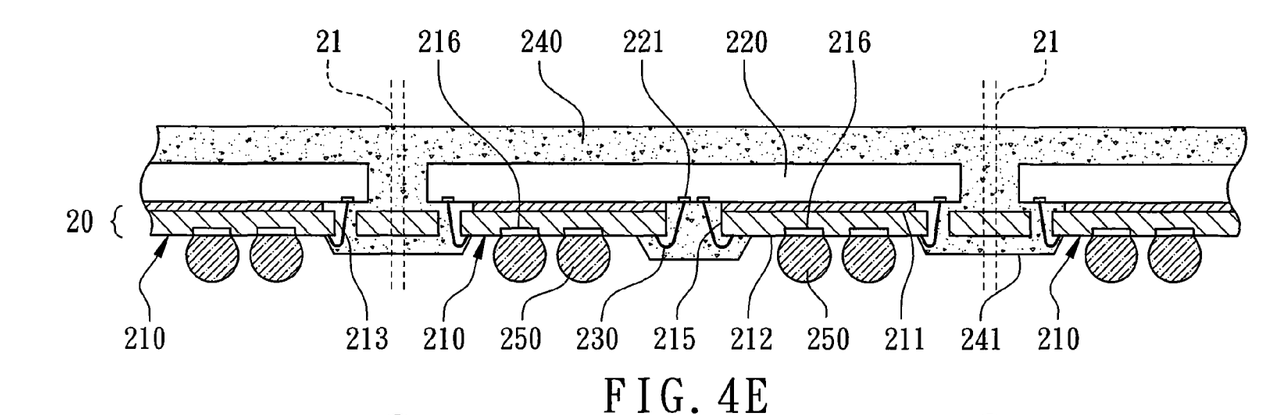

As shown in FIG. 4E, the method mentioned above further comprises the step of: placing a plurality of external terminals 250 on the external pads 216. The external terminals 250 can be a plurality of metal balls, solder pastes, contact pads, or contact pins. In the present embodiment, the external terminals 250 include a plurality of solder balls to assemble a plurality of window-type semiconductor packages with small windows. After singulation, the external terminals 250 act as electrical connections from the chips 220 to an external printed circuit board (PCB) by SMT technologies.

Figure 4F:
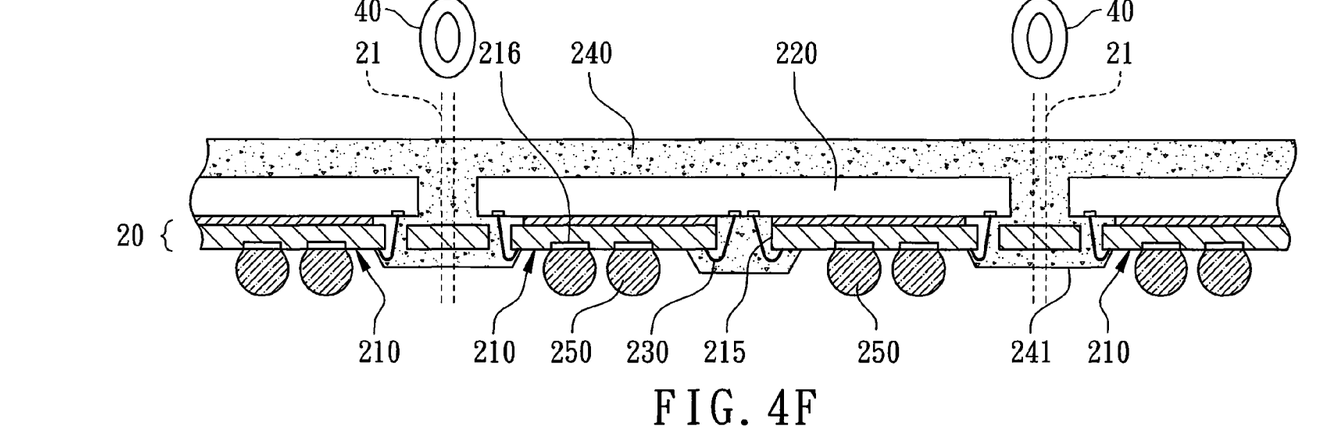

Finally, as shown in FIG. 4F, a sawing tool 40 saw through the substrate strip 20 and the encapsulant 240 along the scribe lines 21 to form a plurality of individual semiconductor packages 200, as shown in FIG. 6. During the singulation, the sawing tool 40 not only saws through the substrate strip 20 but also through the encapsulant 240 on the window molding areas 214 across the scribe lines 21. Moreover, when the substrate units 210 are singulated from the substrate strip 20, the encapsulant 240 on the window molding areas 214 encapsulates at least a portion of the scribe lines 21. It can prevent delamination of traces and solder mask of the substrate units 210 to enhance the quality and reliability of the packages. Moreover, the scribe lines 21 can be reserved for the possible mold flash area of the encapsulant 240 on the external surface 212, therefore, the possibilities of mold flashes occur within the substrate units 210 and the risk of contamination of external pads 216 are greatly reduced.

Furthermore, a window-type BGA semiconductor package fabricated from the method mentioned above is also revealed. As shown in FIG. 6, the package 200 primarily comprises a substrate unit 210, a chip 220, a plurality of electrical connecting components 230, and an encapsulant 240. The substrate units 210 are formed by singulation from the substrate strip 20, as shown in FIG. 3, where the substrate unit 210 has a plurality of small windows 213 penetrating from the die-attaching surface 211 to the external surface 212. The small windows 213 are formed at the sides or/and at the corners of the substrate units 210. In the present embodiment, the small windows 213 can be adjacent to but without extending to the sides or/and corners of the substrate units 210. As shown in FIG. 3 again, the external surface 212 includes a plurality of window molding areas 214 surrounding the small windows 213 and extending to the sides or/and corners of the substrate units 210. The chip 220 is deposited on the die-attaching surface 211 and is electrically connected to the substrate unit 210 by the electrical connecting components 230 through the small windows 213.

Furthermore, the encapsulant 240 is formed on the window molding areas 214 and in the small windows 213 of the substrate units 210 to encapsulate the electrical connecting components 230. Additionally, the encapsulant 240 on the window molding areas 214 has a plurality of first singulated sidewalls 242 perpendicular to the external surface 212 and aligned to the sides of the substrate units 210 where the first singulated sidewalls 242 are formed during the singulation of the substrate units 210. The first singulated sidewalls 242 have a thickness extruded from the external surface 212 so that the traces and solder mask of the substrate unit 210 are protected without delamination. Preferably, the encapsulant 240 on the window molding areas 214 are formed as a plurality of insulating bumps 241 having the first singulated sidewalls 242. Furthermore, the encapsulant 240 is further formed on the die-attaching surface 211 to have a second singulated sidewall 243 perpendicular to the die-attaching surface 211 and aligned to the sides of the substrate unit 210. Therefore, the insulating bumps 241 are placed in the small windows 213 and are integrated with the encapsulant 240 on the die-attaching surface 211 to generate strong bonding.

Therefore, according to the invention, the encapsulant 240 on the window molding areas 214 extends to the scribe lines 21 on the external surface 212 of the substrate strip 20 so that the scribe lines 21 are reserved for the possible mold flash area of the encapsulant 240. It will eliminate mold flashes around the small windows 213 in the substrate units 210. Furthermore, during the singulation of substrate strip 20, the first singulated sidewalls 242 of the insulating bumps 241 are created to extrude from the external surface 212 to protect the traces and solder mask of the substrate unit 210 from delamination. It enhances the protection at the edges or/and the corners of the substrate units 210 to increase the quality and reliability of the packages.

Figure 7:
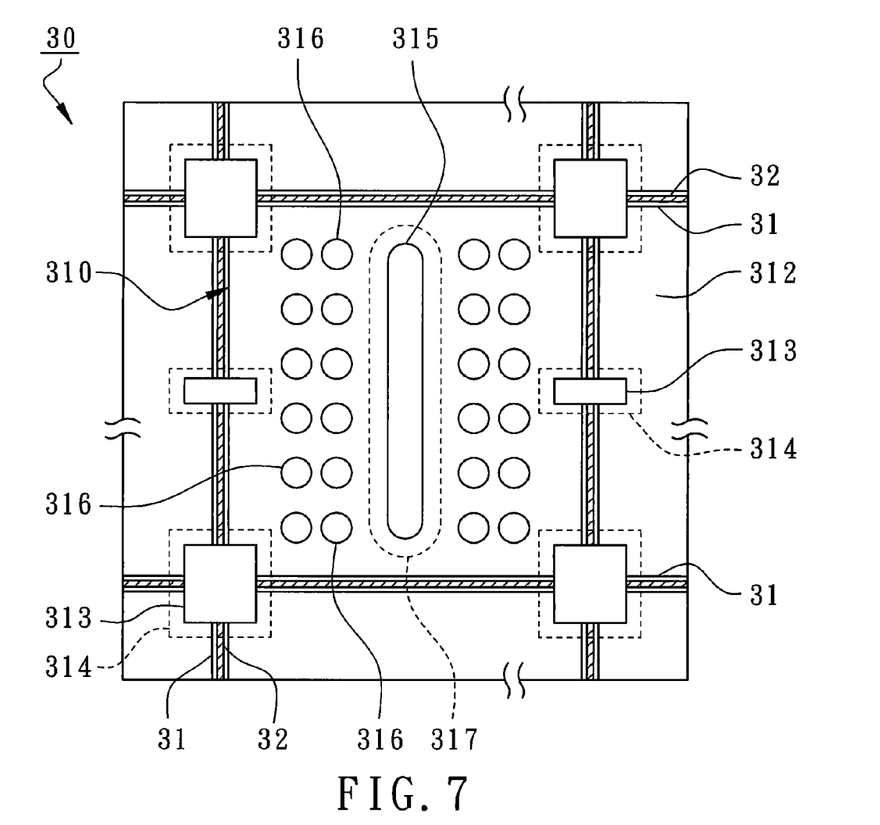
FIG. 7 shows an external surface of a substrate unit of a substrate strip for window-type BGA packages according to the second embodiment of the present invention.
Figure 8:
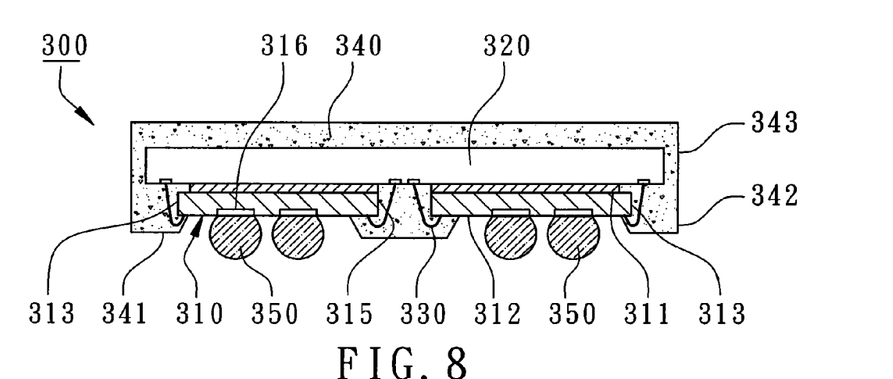
FIG. 8 shows a cross-sectional view of a fabricated window-type BGA package according to the second embodiment of the present invention.

Another window type semiconductor package and its fabricating method are revealed in the second embodiment of the present invention. As shown in FIG. 8, the semiconductor package 300 primarily comprises a substrate unit 310, a chip 320, a plurality of electrical connecting components 330, and an encapsulant 340. As shown in FIGS. 7 and 8, the substrate unit 310 has a die-attaching surface 311, an external surface 312, and a plurality of small windows 313 penetrating the substrate unit 310. The substrate unit 310 is formed by singulation from a substrate strip 30, as shown in FIG. 7. Scribe lines 31 are formed on the external surface 312 between the adjacent substrate units 310. The chip 320 is disposed on the die-attaching surface 311. The chip 320 is electrically connected to the substrate unit 310 by the electrical connecting components 330 passing through the small windows 313.

As shown in FIG. 7, the small windows 313 are formed at the sides or/and corners of the substrate units 310 and the external surface 312 includes a plurality of window molding areas 314 surrounding the small windows 313 extending to the sides of the substrate units 310. In the present embodiment, two adjacent small windows 313 in different substrate units 310 surrounding by the window molding area 314 are bridged across the scribe lines 31 to form a whole molding via to reduce the cut side area of the substrate units 310. It will eliminate delamination of the substrate units 310 during singulation and enhance anti-humility property of the package 300. Furthermore, the substrate unit 310 further has a central slot 315 penetrating from the die-attaching surface 311 to the external surface 312. The external surface 312 includes a bottom molding area 317 to surround the central slot 315 without extending to the scribe lines 31. Furthermore, the substrate unit 310 further has a plurality of external pads 316 formed on the external surface 312 for disposing a plurality of external terminals 350. The chip 320 is electrically connected to the external terminals 350 through the substrate units 310 to provide electrical connections of the semiconductor package 300 to an external printed circuit board, not shown in the figure.

The encapsulant 340 is formed on the window molding areas 314 and in the small windows 313 of the substrate unit 310 to encapsulate the electrical connecting components 330. The encapsulant 340 has a plurality of first singulated sidewalls 342 extruded from and perpendicular to the external surface 312 and aligned to the sides of the substrate unit 310. Moreover, the encapsulant 340 completely covers the die-attaching surface 311 and has a second singulated sidewall 343 aligned to the sides of the substrate unit 310. Since the adjacent small windows 313 at different substrate units 310 are connected and extended to the corresponding sides of the substrate units 310, therefore, the first singulated sidewalls 342 and the second singulated sidewall 343 are connected to each other at the small windows 313. After encapsulation and singulation, the encapsulant 340 is formed as a plurality of insulating bumps 341 on the window molding areas 314.

In this embodiment, the small windows 313 after singulation of the substrate units 310 become "U" or "L" shapes of open indentations connecting to the sides or the corners of the substrate unit 310 to simplify the design of the bottom mold to further reduce the cost of tooling design.

Preferably, as shown in FIG. 7, before the singulation step, a plurality of moldflash guiding grooves 32 is formed in the external surface 312 of the substrate strip 30 and is aligned within the scribe lines 31 to pass through the window molding area 312 so that the scribe lines 314 can be used as mold flash area to eliminate the contaminations of external pads 316 from mold flashes inside the substrate units 310.

The above description of embodiments of this invention is intended to be illustrative and not limiting. Other embodiments of this invention will be obvious to those skilled in the art in view of the above disclosure.

What is claimed is:

1. A window-type semiconductor package comprising:
a substrate unit formed by singulation from a substrate strip, having a die-attaching surface, an external surface and a plurality of small windows, wherein the small windows are formed at a plurality of corners of the substrate unit, wherein the external surface includes a plurality of window molding areas surrounding the small windows and extending into the sides of the substrate unit, wherein the substrate unit further has a central slot formed at the center thereof, and the central slot is longer than the small windows;
a chip deposited on the die-attaching surface, wherein the chips are disposed within the substrate unit without covering the sides of the substrate unit, the small windows expose a plurality of peripheries of an active surface of the chip, the central slot exposes a center of the active surface of the chip;

a plurality of electrical connecting components formed through the small windows to electrically connect the chip to the substrate unit; and an encapsulant formed on the window molding areas and in the small windows to encapsulate the electrical connecting components, wherein the encapsulant on the window molding areas has a plurality of first singulated cut sidewalls perpendicular to the external surface and aligned to the sides of the substrate unit wherein some of the electrical connecting components are formed through the central slot, wherein the external surface further includes a bottom molding area surrounding the central slot, wherein the encapsulant is further formed in the central slot and on the bottom molding area;

wherein the encapsulant is further formed on the die-attaching surface to encapsulate at least a portion of the chip; and wherein the encapsulant completely covers the die-attaching surface and has a second singulated cut sidewall perpendicular to the die-attaching surface and aligned to the sides of the substrate unit.

2. The semiconductor package as claimed in claim 1, wherein the smaller windows are a plurality of open indentations connecting to at least an adjacent side of the substrate unit.

3. The semiconductor package as claimed in claim 1, wherein the chip has a plurality of bonding pads aligned within the small windows for electrical connections of the electrical connecting components.

4. The semiconductor package as claimed in claim 1, wherein the footprint of the chip on the substrate unit is not smaller than 70% of the die-attaching surface.

5. The semiconductor package as claimed in claim 1, wherein the electrical connecting components include a plurality of bonding wires.

6. The semiconductor package as claimed in claim 1, wherein the substrate unit further has a plurality of external pads formed on the external surface, and further comprising a plurality of external terminals disposed on the external pads.

7. The semiconductor package as claimed in claim 1, wherein the encapsulant on the window molding areas are formed as a plurality of insulating bumps having the first singulated cut sidewalls.

* * * * *